(12) United States Patent
Darnell

(10) Patent No.: US 10,445,072 B1
(45) Date of Patent: Oct. 15, 2019

(54) EXECUTION ORDER BLOCK FOR GRAPHICAL PROGRAMMING

(71) Applicant: Altair Engineering, Inc., Troy, MI (US)

(72) Inventor: Peter Darnell, Westford, MA (US)

(73) Assignee: Altair Engineering, Inc., Troy, MI (US)

( * ) Notice: Subject to any disclaimer, the term of this patent is extended or adjusted under 35 U.S.C. 154(b) by 353 days.

(21) Appl. No.: 15/402,543

(22) Filed: Jan. 10, 2017

Related U.S. Application Data

(60) Provisional application No. 62/277,265, filed on Jan. 11, 2016.

(51) Int. Cl.
*G06F 8/35* (2018.01)
*G06F 8/34* (2018.01)
*G06F 9/44* (2018.01)

(52) U.S. Cl.
CPC . *G06F 8/35* (2013.01); *G06F 8/34* (2013.01)

(58) Field of Classification Search
CPC .................................................. G06F 8/34–35
USPC ....................................................... 717/105
See application file for complete search history.

(56) References Cited

U.S. PATENT DOCUMENTS

| | | | | |
|---|---|---|---|---|
| 6,802,053 B1* | 10/2004 | Dye | ......................... | G06F 8/34 717/113 |
| 7,062,718 B2* | 6/2006 | Kodosky | ............ | G05B 19/0426 703/21 |
| 7,134,086 B2* | 11/2006 | Kodosky | ................... | G06F 8/34 715/763 |
| 7,720,656 B2* | 5/2010 | Raghavan | ................. | G06F 8/34 703/6 |
| 7,774,172 B1* | 8/2010 | Yunt | ........................ | G06F 8/34 703/2 |
| 7,890,542 B1* | 2/2011 | Taitel | ...................... | G06F 17/50 707/802 |
| 2002/0157086 A1* | 10/2002 | Lewis | ..................... | G06F 8/314 717/127 |
| 2009/0199157 A1* | 8/2009 | Ishii | ......................... | G06F 8/34 717/105 |

OTHER PUBLICATIONS

Di Natale et al., "Buffer Optimization in Multitask Implementations of Simulink Models", ACM, 2008, 32pg. (Year: 2008).*

(Continued)

*Primary Examiner* — Ryan D. Coyer
(74) *Attorney, Agent, or Firm* — Fish & Richardson P.C.

(57) ABSTRACT

A graphical block diagram can use an execution order block to enforce an execution order for parallel subtrees. A graphical data flow block diagram is generated that includes parallel subtrees. The parallel subtrees can be connected to input pins of the execution order block in the execution order. The parallel subtrees are processed in the execution order before other blocks connected to the parallel subtrees are processed according to the normal execution order of the graphical program. The execution order of the execution order block is not affected by the other blocks, and the normal execution order of the other blocks according to the graphical program is not affected by the execution order of the execution order block. The techniques described herein improve a model-based development platform.

19 Claims, 3 Drawing Sheets

(56) References Cited

OTHER PUBLICATIONS

Oh et al., "Software safety analysis of function block diagrams using fault trees", Elsevier, 2004, 14pg. (Year: 2004).*
Pawletta et al., "Ontology-Assisted System Modeling and Simulation within MATLAB/ Simulink", Simulation Notes Europe, 2014, 11pg. (Year: 2014).*
Rebeschiess, Sven, "MIRCOS—Microcontroller-Based Real Time Control System Toolbox for use with Matlab / Sinnulink", IEEE, 1999, 6pg. (Year: 1999).*

* cited by examiner

EXECUTION ORDER BLOCK FOR GRAPHICAL PROGRAMMING

CROSS-REFERENCE TO RELATED APPLICATION

This application claims priority to U.S. Provisional Patent Application No. 62/277,265, filed on Jan. 11, 2016, the contents of which are incorporated herein in their entirety by reference.

TECHNICAL FIELD

This disclosure is directed generally to graphical programming in a model-based platform, and more particularly to a platform capable of executing blocks in a specified order using an execution order block.

BACKGROUND

Graphical programming is a method of programming using interconnected graphical blocks. In graphical data flow diagrams, execution order is dictated by the directional connectivity of the blocks. This is in contrast to text-based languages like C and FORTRAN, which are generally ordered left to right and top down, but are subject to the dictates of such programming constructs as function calls and "goto" statements. Graphical programming can also be used to generate state diagrams. State diagrams and graphical data flow diagrams may be referred to as math models, so a graphical program may be referred to as a model-based platform.

SUMMARY

According to one apparatus described herein for specifying an execution order of subtrees in a graphical block diagram, graphical blocks are stored within a non-transitory storage medium, the graphical blocks comprising at least an execution order block including a variable number of input pins, and the execution order block defining an execution order of a graphical block attached to each input of the variable number of input pins. A graphics processor is configured to, responsive to user input, generate a graphical block diagram for display on an output screen. The graphical block diagram comprises at least some of the graphical blocks arranged in parallel subtrees of a root graphical block, the parallel subtrees including at least a first subtree and a second subtree, and the graphical block diagram includes the execution order block, the variable number of input pins comprising at least a first input and a second input. The first subtree is connected to the first input and the second subtree connected to the second input. The apparatus includes a graphical block diagram parser that interprets the graphical block diagram such that, when the graphical block diagram is executed, the first subtree and the second subtree are executed according to the execution order of the execution order block.

Interpreting the graphical block diagram can include, for example, executing the graphical block diagram or generating code corresponding to the graphical block diagram.

A method for processing a graphical block diagram described herein includes receiving, at a computing device, a graphical block diagram comprising graphical blocks, at least some of the graphical blocks arranged in parallel subtrees of a root graphical block, the parallel subtrees including at least a first subtree and a second subtree, and the graphical block diagram including an execution order block having at least a first input and a second input, the first subtree connected to the first input and the second subtree connected to the second input. The method also includes interpreting the graphical block diagram such that, when the graphical block diagram is executed, the first subtree and the second subtree are executed according to an execution order of the execution order block before other graphical blocks connected to the root graphical block without affecting an execution order of the other graphical blocks, the execution order of the execution order block defined by an ordering of inputs of the execution order block, and the execution order of the other graphical blocks based on a layout of the graphical block diagram.

A method for producing a graphical block diagram described herein includes, presenting, for viewing by a user, graphical blocks including at least an execution order block having a variable number of inputs and no output, the execution order block defining an execution order of a graphical block attached to each input of the variable number of inputs. The method also includes generating, responsive to input from the user, a graphical block diagram for display on an output screen, the graphical block diagram comprising at least some of the graphical blocks arranged in parallel subtrees of a root graphical block, the parallel subtrees including at least a first subtree and a second subtree, and the graphical block diagram including the execution order block, the variable number of inputs comprising at least a first input and a second input, the first subtree connected to the first input and the second subtree connected to the second input, and interpreting the graphical block diagram such that, when the graphical block diagram is executed, the first subtree and the second subtree are executed according to the execution order of the execution order block.

These and other aspects of the present disclosure are disclosed in the following detailed description of the embodiments, the appended claims and the accompanying figures.

BRIEF DESCRIPTION OF THE DRAWINGS

The description herein makes reference to the accompanying drawings described below wherein like reference numerals refer to like parts throughout the several views.

DETAILED DESCRIPTION

Figure 1:
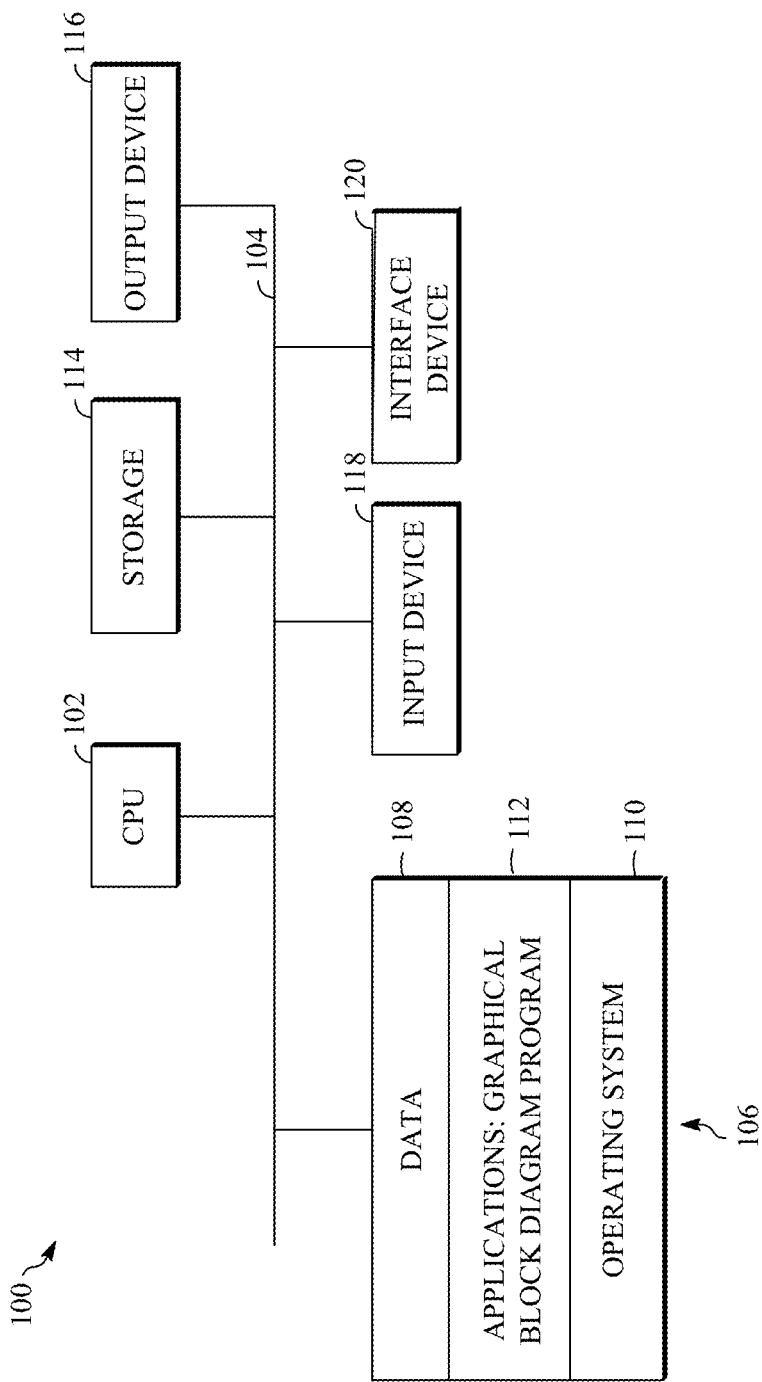
FIG. 1 is a block diagram of an example of a computing device that can implement the teachings herein.

Graphical block diagrams are popular because the user does not have to learn a text-based syntax. One graphical programming environment is the VisSim™ system development software, which allows the easy creation of math models and is hence often referred to as a model-based platform. A graphical data flow block diagram (GDFBD)

developed within the software consists of a plurality of interconnected blocks where at least a subset of the connections among the blocks indicates that data produced by a block is used by another block.

Graphical block diagrams may be designed for different operating modes. In a code generation mode, functions associated with blocks within a graphical block diagram are used to generate code to run on a processor in a processor-controlled system in accordance with the layout (also called the arrangement) of the blocks. When targeting a specific microprocessor chip for code generation, for example, the diagram usually contains blocks representing specific hardware features of the chip like Controller Area Network (CAN) bus ports, a serial port, an analog-to-digital converter (ADC) or pulse-width modulation (PWM) port, etc. Using these blocks, data may be read and written to the target (e.g., an embedded chip). While these blocks are useful for code generation, particularly embedded code generation, different blocks are most often required for other modes. In a simulation mode, for example, blocks are included to simulate inputs and responses from a processor-controlled system according to the arrangement of blocks within the graphical block diagram.

Whether a graphical block diagram is created for a simulation mode, a code generation mode, or both, or some other operating mode(s), a benefit of graphical block diagrams is the lack of a text-based syntax that the user would otherwise have to learn in order to program. This frees the user from specifying order of execution, for example, as the ordering falls naturally based on the "wiring" interconnectivity, whatever the operating mode. At times, however, there is no implied order to the connections. That is, graphical block diagrams are a collection of connected graphical blocks that can be considered a set of parallel subtrees. In the event that more than one subtree exists, it may not be clear which subtree is to be executed first. Certain algorithms, like receipt of serial data packets, require specific ordering of read execution. One solution is to use a page position of the tree (or subtree) root block to determine execution order in a top-down fashion. In other words, if a first tree root block is above a second tree root block in a page view of the graphical block diagram, the first tree root block and its subtrees are executed before the second tree root block and its subtrees. While this can work in some cases, it is insufficient in the case where there is not a clear single subtree root for each read. Ordering execution between unconnected portions in the graphical block diagram is not necessarily clear.

In contrast, the teachings herein describe a system, apparatus, and method for producing a graphical block diagram using an execution order block. The teachings herein also describe a system, apparatus, and method for using a graphical block diagram having an execution order block. An execution order block is desirably a consumer block that will be executed before other blocks to enforce execution order in the absence of subtree connectivity in a graphical block diagram. The execution order can be based on the pin ordering of the execution order block. Other details are described herein after first describing an environment in which the disclosure may be implemented.

FIG. 1 is a block diagram of an example of a computing device 100 that can implement the teachings herein. The computing device 100 can be in the form of a computing system including multiple computing devices, or in the form of a single computing device, for example, a server computer, a mobile phone, a tablet computer, a laptop computer, a notebook computer, a desktop computer, and the like.

A processor in the computing device 100 can be a central processing unit (CPU) 102. Alternatively, the processor can be any other type of device, or multiple devices, capable of manipulating or processing information now-existing or hereafter developed. Although a single processor as shown, e.g., CPU 102, more than one processor may be used to improve speed and efficiency. The CPU 102 communicates with other components of the computing device 100, and optionally with external devices (e.g., other computing devices) through a bus 104.

A memory 106 in the computing device 100 can be a read only memory (ROM) device or a random access memory (RAM) device. Any other suitable type of non-transitory storage device can be used as the memory 106. The memory 106 can store data 108 that is accessed by the CPU 102 using the bus 104, such as data used in the implementations herein. The memory 106 can further include an operating system 110 and one or more application programs, including at least one graphical block program 112 that permits the CPU 102 to perform the methods described here. The computing device 100 can also include supplemental storage 114, which is, in some examples, a removable memory card of any type. The supplemental storage 114 can include any non-transitory storage medium. Data used in implementations herein may can be stored in whole or in part in the supplemental storage 114 and loaded into the memory 106 as needed for processing.

The computing device 100 can also include one or more output devices 116, such as a display. Each output device 116 can be coupled to the CPU 102 via the bus 104. When the output device 116 is or includes a display, the display can be implemented in various ways, including by a liquid crystal display (LCD), a cathode-ray tube (CRT) display, or a light emitting diode (LED) display, such as an organic LED (OLED) display. The display may be, in one example, a touch sensitive display that combines a display with a touch sensitive element that senses touch inputs. Other output devices that permit a user to program or otherwise use the computing device 100 can be provided in addition to a display.

The computing device 100 can also include or be in communication with one or more input devices 118. The input device 118 may be an image sensing device such as a camera, an audio sensing device such as a microphone, or a contact input device such as a keyboard and/or a mouse. When the input device 118 is an image sensing device, it may receive input from facial or hand gestures from a user instead of conventional keyboard or mouse inputs for use in controlling the computing device 100. Similarly, the input device 118 may receive input from verbal commands to control the computing device 100 when the input device 118 is or includes an audio sensing device.

In the computing device 100 of FIG. 1, an interface device 120 is coupled to the bus 104. In some implementations, the CPU 102 is capable of directly communicating with external devices, such as other computing devices, through the bus 104. In others, a communication protocol between the computing device 100 and one or more external devices is different such that the interface device 120 is desirable for the CPU 102 and other components of the computing device 100 to receive information from and transmit information to one or more external devices.

The computing device 100 can be implemented in a wide variety of configurations. For example, and although FIG. 1 depicts the CPU 102 and the memory 106 of the computing device 100 as being integrated into a single unit, other configurations are possible. The operations of the CPU 102 can be distributed across one or more of processors in multiple different machines that can be coupled directly or across a local area or other network through the interface device 120. The memory 106 can be distributed across multiple machines, such as in network-based memory. Although depicted here as a single bus, the bus 104 of the computing device 100 can be composed of multiple buses. Further, the supplemental storage 114 can be directly coupled to the other components of the computing device 100 or can be accessed via a network and can comprise a single integrated unit such as a memory card or multiple units such as multiple memory cards.

Components may be omitted from, or additional components included in, the computing device 100. For example, the computing device 100 may form part of an embedded system that includes integrated microcontrollers or processors implementing specific functions and, optionally, mechanical devices operating using those specific functions.

Figure 2:
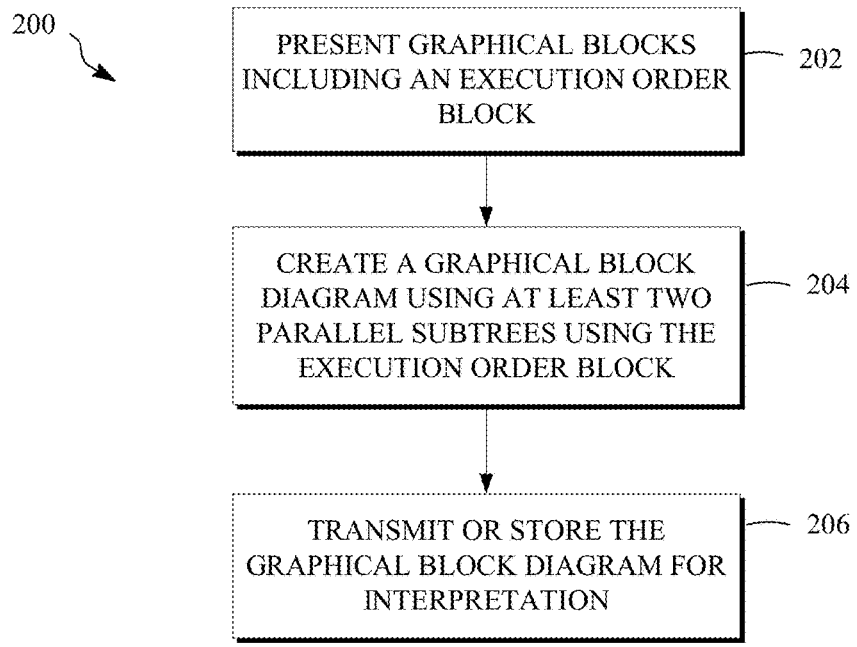
FIG. 2 is a flow chart diagram of a method for producing a graphical block diagram including an execution order block.

FIG. 2 is a flow chart diagram of a method 200 for producing a graphical block diagram using an execution order block. FIG. 2 can be implemented within a host computer or other processor-based device now or hereafter known in the computing arts, such as that shown in FIG. 1. For example, and with reference to FIG. 1, the operations of the method 200 may be performed by the CPU 102 based on an application program 112 stored in the memory 106. FIG. 2 is shown as a series of steps for convenience only—the various operations may be performed in various orders, while some may be skipped and others added and still being within the scope of the disclosure.

The method 200 as shown in FIG. 2 includes presenting graphical blocks including an execution order block at 202, generating a graphical block diagram using at least two parallel subtrees using the execution order block at 204, and transmitting or storing the graphical block diagram for interpretation at 206.

The graphical blocks may be stored within a non-transitory storage medium, such as the memory 106 and/or the supplemental storage 114, and may be presented for selection to generate the graphical block diagram. For example, the graphical blocks may be presented by accessing them, in whole or in part, from the storage medium and transmitting them to an output device (e.g., output device 116), such as a display. The graphical blocks may alternatively be transmitted to the computing device of a user, such as through the interface device 120, for display by the computing device of the user.

The graphical blocks presented at 202 may include blocks exclusive to one operating mode where multiple operating modes are available. The multiple operating modes include, in some implementations, a code generation mode and a simulation mode. The multiple operating modes may additionally or alternatively include a validation mode. The code generation mode, simulation mode, and validation mode are discussed in additional detail below. The graphical blocks may also include graphical blocks that can be used in more than one of the multiple operating modes. These graphical blocks can include variable blocks, decision blocks, etc. These graphical blocks can include blocks that receive different input values and/or output different output values depending upon the operating mode. The graphical blocks can define or represent functions or variables, such as arithmetic or Boolean operators. So as to enforce an execution order, the graphical blocks can include an execution order block. The execution order block, and other examples of available graphical blocks, are discussed in more detail below.

Generating or creating a graphical block diagram at 204 can include creating the graphical block diagram for display on an output screen. The graphical block diagram can be generated by receiving input from a user through an input device, such as the input device 118. The input includes, for example, the selection and arrangement of at least some of the graphical blocks to form a mathematical model. The graphical block diagram is created at 204 by a server remote from the user using its graphics processor, or is created at 204 by the graphics processor of a user's local computer. The graphics processor can be, for example, integral with the output device 116, e.g., when the output device 116 is an output screen, display, or graphical user interface, and the graphics processor interfaces with the CPU 102 to generate the graphical block diagram.

The graphical block diagram can, for example, include a first subtree and a second subtree, and optionally additional subtrees, connected to a common tree root or root graphical block. In this way, the subtrees can be said to be parallel subtrees of the root graphical block. The common tree root or root graphical block may also referred to as a tree root graphical block or a subtree root graphical block herein, depending on the layers of graphical blocks within the "tree." That is, for example, each subtree may be directly connected to a tree root graphical block or to the tree root graphical block through one or more subtree root graphical blocks, and still be considered parallel subtrees. Each of the parallel subtrees may include one graphical block or may include multiple graphical blocks.

Figure 3:
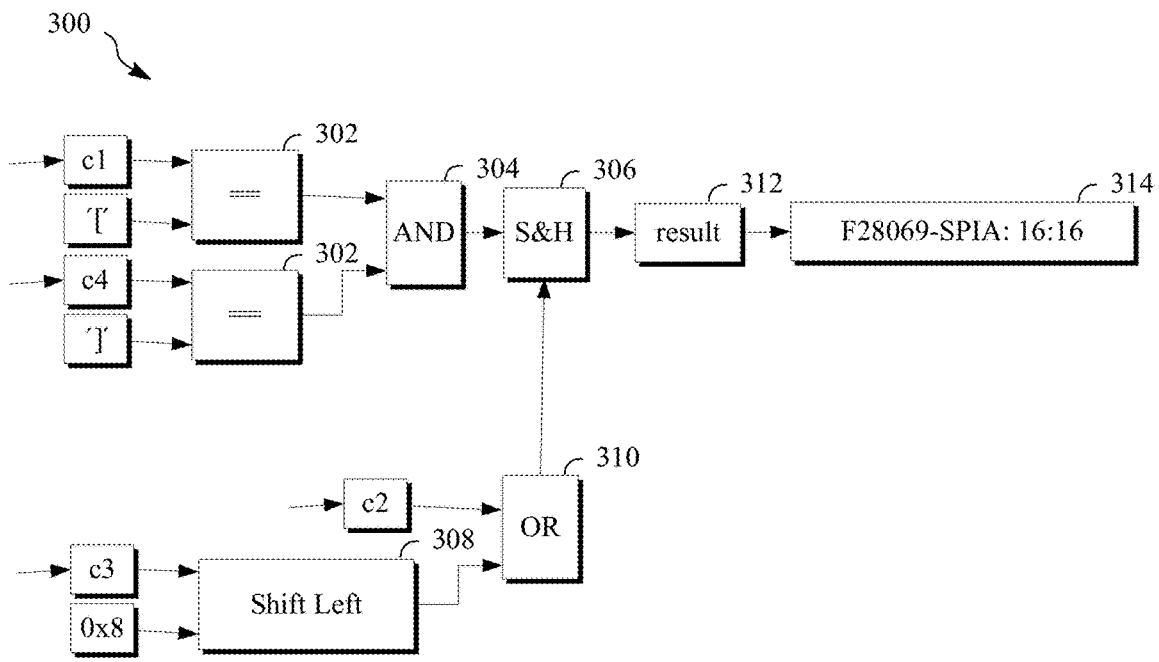
FIG. 3 is portion of a graphical block diagram produced according to the teachings herein.

This terminology can be explained by reference to the graphical block diagram 300 of FIG. 3. FIG. 3 is portion of a graphical block diagram 300 produced according to the teachings herein. The graphical block diagram 300 of FIG. 3 is a data flow diagram produced according to the method 200 of FIG. 2. In this example, the continuous control of a plant is shown. The simulation, application (e.g., the code generation), and verification of any other data flow process, particularly a continuous control process, is also possible.

At least some of the graphical blocks used in the graphical block diagram 300 (and the graphical block diagram 500 described below) define respective functions while others define variables, operators, etc. By define, the present disclosure means to store, associate, assign, implement or otherwise represent one or more functions by a graphical block. The graphical block c1 and the graphical block '[' are parallel subtrees of one of the root graphical blocks 302. Each of the root graphical blocks 302 may be referred to as a subtree root graphical block, and they form parallel subtrees of the graphical block 304. Because the graphical block c4 and the graphical block ']', are parallel subtrees of the other of the root graphical blocks 302, the graphical block c1 can also be considered a subtree parallel to each of subtrees represented by the graphical blocks c4 and ']', where the root graphical block for these subtrees is the graphical block 304. The graphical block 304 may also be referred to as a subtree root graphical block, as it defines a subtree in parallel with the subtree extending from the subtree root graphical block 310 relative to the root graphical block 306. That is, the root graphical blocks 304, 310 are root subtree graphical blocks identifying parallel subtrees, and the graphical blocks extending from the root graphical blocks 304, 310 can be said to be parallel to each other relative to the root graphical block 306. The root graphical block 306 may be referred to the tree root graphical block as it is the level in the layers of graphical blocks where the tree roots first branch into parallel subtrees. In some cases, as in this example, the tree root graphical block 306 is connected to additional graphical blocks that use the output of the block 306.

Figure 4:
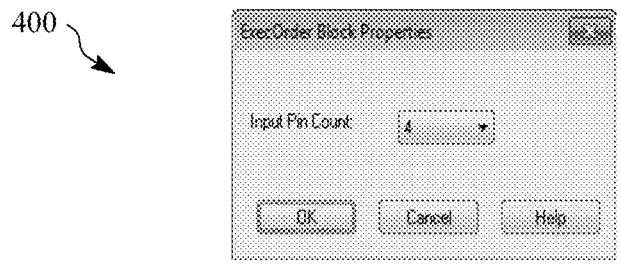
FIG. 4 is a dialog box for establishing the properties of an execution order block.
Figure 5:
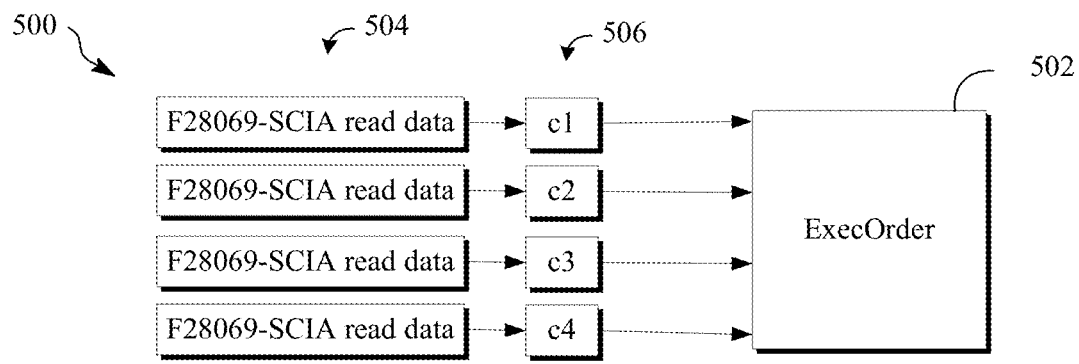
FIG. 5 is another portion of a graphical block diagram produced according to the teachings herein.

Referring again to FIG. 2, the graphical block diagram generated at 204 also includes one or more execution order blocks. An execution order block, in the example, is a consumer block. That is, it includes input pins but no output pin such that it provides or generates no output. In some cases, the execution order block may have an output pin, but that output pin would provide no output or provide an output unconnected to another block such that is it would desirably not used in any way that would affect processing of any of the subtrees to which it is connected (or any of the graphical blocks connected to the subtrees), as discussed in further detail below. Responsive to user input, an execution order block may be added to a graphical block diagram, such as the graphical block diagram 300 in an example. Attributes or properties may be added to the execution order block through, for example, a dialog box that is accessed by a conventional right-click on the block or another technique available through the graphics processor. FIG. 4 shows an example of a dialog box 400 that can be used to select the input pin count of an execution order (ExecOrder) block. FIG. 5 is a portion of a graphical block diagram 500 that shows an execution order block 502 with four input pins connected to respective inputs as described in more detail below. The input pins of an execution order block may also be referred to as inputs, and the terms input pin and input may be used interchangeably herein when referring to an execution order block. The execution order block can define an execution order of a graphical block attached to each input of the variable number of input pins.

Parallel subtrees of a graphical block diagram may be ordered (e.g., for execution) by their connection to an execution order block. For example, the execution order may be defined by the numbering sequence of the input pins, such that the subtree connected to the first pin is executed first, the subtree connected to the second pin, if any, is executed second, the subtree connected to the third pin, if any, is executed third, and so on. Alternatively or additionally, the execution order may be defined by the arrangement of the input pins. For example, the execution order may be a top-down order of the input pins as arranged for display on the output screen, where the subtree connected to the top pin is executed first, followed in order by the subtrees, if any, connected to remaining input pin(s). In these ways, the subtrees may be executed according to the execution order of the execution order block.

How a graphical block diagram using an execution order block is created may be described using the examples of FIG. 3-5. Referring first to FIG. 3, a graphical block diagram may be first created by a graphics processor, responsive to user input, arranging graphical blocks on a display or output screen, such as the output device 116. The graphical blocks are arranged such that at least two parallel subtrees exist. In FIG. 3, for example, there are a number of parallel subtrees as explained above, including without limitation. Next, an execution order block may be inserted into the graphical block diagram, such as the execution order block 502 of FIG. 5. The placement of the execution order block can vary depending on the rules used by the graphical block diagram program to parse the layout of graphical block diagrams within a page on the display. The execution order block may be placed at the top of the page. The execution order block may be placed above the portion of the graphical block diagram to which it is connected. The execution order block may be placed relative to other execution order blocks so that the execution order blocks are executed in a desired order or sequence. In one example, the graphical block diagram 500 is located above the graphical block diagram 300 within a page, such that each forms a portion of a larger graphical block diagram.

Once the execution order block 502 is placed within the graphical block diagram, a dialog box presented when selecting (e.g., "clicking") the execution order block 502, such as the dialog box 400, may be used to specify the input pin count. Then, the subtrees are connected according a desired execution sequence. In FIG. 5, four input pins are used for four subtrees, namely the subtrees comprising respective graphical blocks c1, c2, c3, c4. The order of graphical blocks c1, c2, c3, c4 in FIG. 5 dictates the order in which the subtrees are executed, regardless of their placement in FIG. 3. In this case, and as described in more detail below, the graphical blocks c1, c2, c3, c4 are variable blocks 506 that receive data respectively read from a hardware device register (F28069) by hardware I/O graphical blocks 504. The hardware device register, for example, belongs to a device to be controlled, such as a plant to be controlled according to code generated from the graphical block diagram, or belongs to a (e.g., hardware) device used in the control of such a plant.

Referring again to FIG. 2, once the graphical block diagram is created at 204, it is transmitted or stored, or both, for interpretation at 206. This may also be done as part of the operation at 204. When the graphical block diagram is created remotely from the user at 204, for example, creating the graphical block diagram may also include transmitting selected graphical blocks and/or code or states associated with selected graphical blocks to a location indicated by a user. The graphical block diagram can be stored at 206, either remotely or locally at the user's computing device. When stored remotely, the graphical block diagram can be transmitted to the user's computing device (e.g., through the interface device 120) at 206. Before transmitting or storing the graphical block diagram at 206, the graphical block diagram may be converted into another format.

Figure 6:
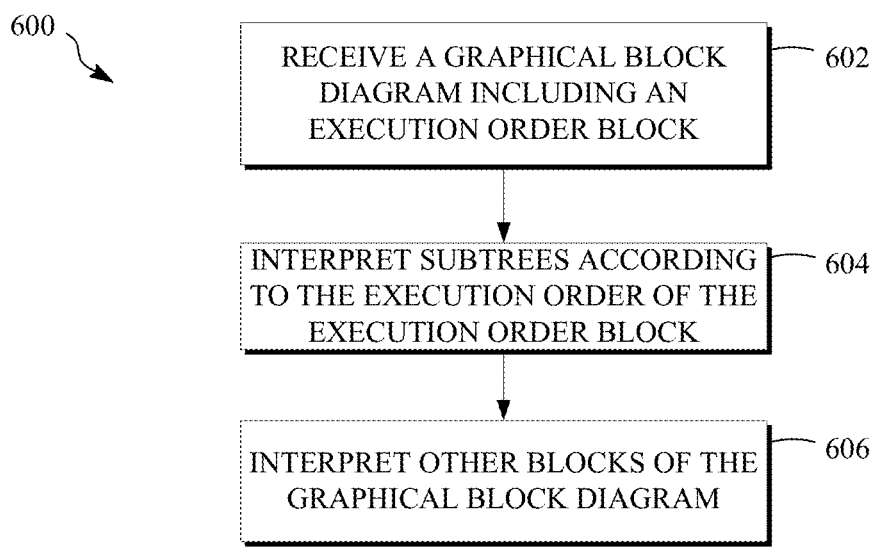
FIG. 6 is a flow chart diagram of a method for processing a graphical block diagram.

FIG. 6 is a flow chart diagram of a method 600 for processing a graphical block diagram including an execution order block. FIG. 6 can be implemented within a host computer or other processor-based device now or hereafter known in the computing arts, such as that shown in FIG. 1. For example, and with reference to FIG. 1, the operations of the method 600 may be performed by the CPU 102 based on an application program 112 stored in the memory 106. FIG. 6 is shown as a series of steps for convenience only—the various operations may be performed in various orders, while some may be skipped and others added and still being within the scope of the disclosure.

The method 600 as shown in FIG. 6 includes receiving a graphical block diagram including an execution order block at 602, interpreting subtrees according to the execution order of the execution order block at 604, and interpreting other blocks of the graphical block diagram at 606.

Receiving the graphical block diagram at 602 can include receiving the graphical block diagram at the computing device of a user from a non-transitory storage medium, such as the memory 106 and/or the supplemental storage 114, in which the graphical block diagram is stored. The graphical blocks may alternatively be received from external of the computing device, such by transmission through the interface device 120 from a source that generated the graphical block diagram. The graphical block diagram may, in some cases, be displayed by the computing device, such as on an output device 116 of FIG. 1, for further manipulation by the user. The graphical block diagram does not have to be received in any particular format.

Referring again to FIG. 6, after the graphical block diagram is received and optionally displayed at 602, it is interpreted at 604 and 606 according to the operating mode. The operating mode may be indicated by a user input, such as the toggling of a mode selector switch using an input device, such as the input device 118 (e.g., a touch-sensitive screen, keyboard, or mouse). The mode selector switch can be displayed on an output device, such as the output device 116, and can be, in some embodiments, a graphical block. The operating mode may be indicated by a variable stored in association with the graphical block diagram that is or indicates the operating mode. In this example, a code generation mode is discussed, but other modes are similarly treated.

Interpretation of the graphical block diagram refers to parsing the block diagram according to the operating mode indicated by the user and the arrangement (including connections) of the block diagram within the page. The operating mode may be a simulation mode that executes the graphical block diagram to simulate a response of a processor-controlled system to a layout of the graphical block diagram. The operating mode may be a code generation mode that generates code to execute the graphical block diagram (e.g., in the processor-controlled system). The code may be a standard batch code such as C. The code may be compiled, such as by the processor, to run on a computer, which could be an embedded computer.

A variety of rules to interpret a graphical block diagram may be used with the teachings herein as long as the execution order block is interpreted, and hence the subtrees interpreted in the execution order at 604, before other graphical blocks connected to the subtrees at 606. For example, where the execution order block is a first execution order block of a plurality of execution order blocks in the graphical block diagram, the graphical block diagram parser can interpret the graphical block diagram by sorting the plurality of execution order blocks before other graphical blocks of the graphical block diagram. The execution order blocks may be sorted by their location within the page, or they may be sorted by the location of the root graphical blocks of the subtrees connected to each. In an example, the graphical block diagram parser, other graphical blocks connected to subtrees connected to its input pins (such as a first subtree and a second subtree), at least in part, according to a top-down order as arranged for display on an output screen.

The example of FIGS. 3 and 5 can be used to describe how a graphical block diagram can be interpreted when it includes an execution order block and the usefulness of an execution order block within a graphical block diagram. The graphical block diagram formed by the graphical block diagrams 300, 500 reads data from a hardware register F28069 and manipulates the data. In this example, it is assumed that the hardware register receives a 4-byte serial packet.

The execution order block 502 is first interpreted by interpreting the subtrees connected to it in the execution order of the execution order block, starting with the first subtree, and proceeding in order with the second, third, and fourth subtrees. For example, the graphical block diagram parser, the graphical block diagram 500 such that, when executed, the first of the hardware I/O blocks 504 reads the first byte and assigns the first byte to the variable graphical block c1, the second of the hardware I/O blocks 504 reads the second byte and assigns the second byte to the variable graphical block c2, the third of the hardware I/O blocks 504 reads the third byte and assigns the third byte to the variable graphical block c3, and the fourth of the hardware I/O blocks 504 reads the fourth byte and assigns the fourth byte to the variable graphical block c4.

The subtrees formed of the graphical blocks c1, c2, c3, c4 (also referred to as subtrees c1, c2, c3, c4) are connected to a root graphical block, a sample and hold (S&H) block 306, through other graphical blocks including but not limited to an AND graphical block 304 and an OR graphical block 310. The subtrees c1 and c4 are connected to a root graphical block, the AND graphical block 304, through respective graphical blocks 302 performing a comparison (", =") function. The subtrees c2 and c3 are connected to a root graphical block, the OR graphical block 310. The subtree c3 is connected to the OR graphical block 310 in parallel with the subtree formed of the constant graphical block "0×8" through the shift left graphical block 308. In the shift left graphical block 308, c3 is the operand, and 0×8 is the number of bits by which the operand is shifted.

In this example, the AND graphical block 304 and the OR graphical block 310 are bitwise operators. The graphical block 312 receives the output or result of the S & H graphical block 306, and writes it to a buffer or hardware I/O block 314. The generated code from the graphical block diagram formed by the combination of FIGS. 5 and 3, where FIG. 5 is interpreted before FIG. 3 is as follows.

static INTERRUPT void cgMain( )
}

Stated simply, the graphical block diagram is interpreted so that, when executed, it reads the 4-byte serial packet in the execution order specified by the execution order block 502. There is a check for matching brackets, i.e., determining whether the first byte (c1) is equal to '[' and whether the fourth byte (c4) is equal to T. Along the parallel subtree using the second and third bytes (c2, c3), the second byte c2 is subjected to a bitwise OR operation with the third byte c3 as subjected to a left shift operation of 8 bytes (one byte). When the brackets match as indicated by an output of "1" from the bitwise AND operator, the OR of the second byte and shifted third byte is written, which comprises 16 bits.

The code above is directed to a specific example of interpreting FIGS. 3 and 5. However, it can be used to describe more broadly the interpretation of a graphical block diagram including an execution order block. According implementations of the teachings herein, the execution order of the subtrees connected to the execution order block is desirably unaffected by other, non-execution order subtree blocks connected to the subtrees. Where first and second subtrees are parallel subtrees of a root graphical block are connected to the input pins of an execution order block, and the first subtree is connected to the root graphical block by a first graphical block, and the second subtree is connected to the root graphical block by a second graphical block, for example, the execution order is not affected by the first graphical block and the second graphical block. Additionally or alternatively, a graphical block diagram parser interprets the graphical block diagram by interpreting the first graphical block and the second graphical block according to an arrangement of the first graphical block and the second graphical block within a layout of the graphical block diagram such that, regardless of the execution order, the first graphical block and the second graphical block are executed after the first subtree and the second subtree are executed, regardless of the placement of the first subtree and second subtree relative to the first and second graphical blocks.

In an example of these concepts shown in FIGS. 3 and 5, the graphical block 308 and the subtree c3 provide an input to a first subtree root graphical block (OR graphical block 310), and the graphical block 302 and the subtree c4 provide an input to a second subtree root graphical block (AND graphical block 304). The first subtree root graphical block is below the second subtree root graphical block in the graphical block diagram as arranged for display on the output screen. In this example, the graphical block diagram parser, the graphical block diagram, at least in part, according to a top-down order as arranged for display on the output screen such that, when the graphical block diagram is executed, the graphical block 302 is executed before the graphical block 308 after executing the subtree c3 and then the subtree c4. The execution order of the two subtrees c3 and c4 as defined by their connections to the input pins of the execution order block 502 is not affected by other blocks to which they are connected. Moreover, the order of executing the other blocks connected to the subtrees c3, c4 is dictated by the parsing rules based on the layout of the graphical block diagram 300, without regard to the execution order.

As mentioned briefly above, the example of FIGS. 3 and 5 demonstrate the usefulness of an execution order block within a graphical block diagram. The graphical block diagram formed by the graphical block diagrams 300, 500 sequentially reads 4 bytes of data from a hardware register F28069. The execution order block enforces the execution order that the variable block c1 receives the first byte, the variable block c2 receives the second byte, the variable block c3 receives the third byte, and the variable block c4 receives the fourth byte. Assuming that the S&H graphical block 306 is a root graphical block, the first subtree, the second subtree, the third subtree, and the fourth subtree are arranged relative to the root graphical block such that, without the execution order block, an order in which the first subtree, the second subtree, the third subtree, and the fourth subtree would be executed is different from the execution order of the execution order block. That is, absent the execution order block, each input to the graphical blocks 302, 310 and 308 currently represented by the subtrees c1-c4 would instead be a graphical block to read the hardware register such as a hardware I/O graphical block 504. Based on the layout of FIG. 3, the first subtree would be executed first, followed by the fourth subtree, the second subtree, and the third subtree. Thus, the first byte would correctly be supplied to the upper graphical block 302, but the second byte would be supplied to the lower graphical block 302, instead of the fourth byte. Further, the third byte would be supplied to the OR graphical block 310, while the fourth byte is left shifted by the graphical block 308, instead of the second byte being supplied to the OR graphical block 310 and the third byte being left shifted by the graphical block 308.

In summary, use of an execution order block can enforce an execution order in parallel subtrees of a graphical data flow block diagram in the absence of subtree connectivity that otherwise indicates a clear single subtree root. This provides more flexibility in programming, in addition to reducing errors in the resulting code.

In the examples described, the execution order block is a consumer block including two or more input pins that is interpreted before other consumer blocks. However, an execution order block may include only one input pin, and multiple execution order blocks, each having one or more input pins, may be arranged so that they are interpreted in a desired order before other consumer blocks.

The code generation mode described in these examples uses C as a standard batch code, but any batch code known or unknown is possible. The resulting code may be used in an embedded processor for control of the target plant, or may be used in any other processor-controlled system. In a simulation mode, the graphical block diagram is executed by simulating a response of a processor-controlled system (e.g., a target plant) to a layout of the graphical block diagrams 300 and 500. In a simulation mode, additional graphical blocks may be included that simulate the target plant. Other operating modes, such as a validation mode are possible. A validation mode may be used for calibration of the model. Calibration can be an iterative process that compares the model to actual system behavior and uses the discrepancies to improve the model until an acceptable level of model accuracy is received. In an implementation including a validation mode, for example, the graphical blocks can include graphical blocks that perform comparisons, graphical blocks that enable different paths within the graphical block diagram, etc.

In the various embodiments and implementations, any of the features and techniques disclosed herein may be used with respect to any of the methods described herein.

While the invention has been described in connection with certain embodiments, it is to be understood that the invention is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An apparatus for specifying an execution order of subtrees in a graphical block diagram, comprising:
one or more processors; and
one or more non-transitory computer-readable media including one or more sequences of instructions which, when executed by the one or more processors, causes the one or more processors to perform operations comprising:
receiving data indicating a set of graphical blocks, the set of graphical blocks comprising:
an execution order block including a plurality of input pins, and
a plurality of additional graphical blocks,
wherein each input pin of the plurality of input pins is attached to respective graphical block of the plurality of additional graphical blocks, and
wherein the execution order block defines an execution order of the graphical blocks attached to the plurality of input pins; and
responsive to user input, generating, using a graphical processor, the graphical block diagram for display on an output screen, the graphical block diagram comprising at least some of the graphical blocks of the set of graphical blocks arranged in parallel subtrees of a root graphical block, the root graphical block being selected from among the set of graphical blocks, the parallel subtrees including at least a first subtree and a second subtree, and the graphical block diagram including the execution order block, the plurality of input pins comprising at least a first input pin and a second input pin, the first subtree connected to the first input pin and the second subtree connected to the second input pin; and interpreting, using a graphical block diagram parser, the graphical block diagram such that, when the graphical block diagram is executed, the first subtree and the second subtree are executed according to the execution order defined by the execution order block.

2. The apparatus of claim 1, wherein the first subtree is connected to the root graphical block by a first graphical block selected from among the set of graphical blocks, the second subtree is connected to the root graphical block by a second graphical block selected from among the set of graphical blocks, and wherein the operations comprise interpreting, using the graphical block diagram parser, the graphical block diagram by interpreting the first graphical block and the second graphical block according to an arrangement of the first graphical block and the second graphical block within a layout of the graphical block diagram such that, regardless of the execution order, the first graphical block and the second graphical block are executed after the first subtree and the second subtree are executed.

3. The apparatus of claim 1, wherein the first subtree is connected to the root graphical block by a first graphical block selected from among the set of graphical blocks, the second subtree is connected to the root graphical block by a second graphical block selected from among the set of graphical blocks, and the execution order is unaffected by the first graphical block and the second graphical block.

4. The apparatus of claim 3, wherein the first graphical block and the first subtree provide an input to a first subtree root graphical block selected from among the set of graphical blocks, the second graphical block and the second subtree provide an input to a second subtree root graphical block selected from among the set of graphical blocks, the first subtree root graphical block is below the second subtree root graphical block in the graphical block diagram as arranged for display on the output screen, and wherein the operations comprise interpreting, using the graphical block diagram parser, the graphical block diagram, at least in part, according to a top-down order as arranged for display on the output screen such that, when the graphical block diagram is executed, the second graphical block is executed before the first graphical block after executing the first subtree and then the second subtree.

5. The apparatus of claim 1, wherein the operations comprise interpreting, using the graphical block diagram parser, the execution order block by sorting the input subtrees to the plurality of input pins of the execution order block in a top-down order as arranged for display on the output screen, the first input pin located above the second input pin.

6. The apparatus of claim 1, wherein the first subtree comprises a first graphical block selected from among the set of graphical blocks that reads a hardware register, the second subtree comprises a second graphical block selected from among the set of graphical blocks that reads the hardware register, and wherein the operations comprise interpreting, using the graphical block diagram parser, the graphical block diagram such that, when executed, the first graphical block reads a first byte of the hardware register before the second graphical block reads a second byte of the hardware register subsequent to the first byte.

7. The apparatus of claim 1, wherein the execution order block is a first execution order block of a plurality of execution order blocks in the graphical block diagram, and wherein the operations comprise interpreting, using the graphical block diagram parser, the graphical block diagram by sorting the plurality of execution order blocks before other graphical blocks of the graphical block diagram.

8. The apparatus of claim 1, wherein the operations comprise interpreting, using the graphical block diagram parser, other graphical blocks connected to the first subtree and the second subtree, at least in part, according to a top-down order as arranged for display on the output screen.

9. The apparatus of claim 1, wherein the operations comprise interpreting, using the graphical block diagram parser, the graphical block diagram according to a simulation mode that executes the first subtree and the second subtree according to the execution order before executing other graphical blocks connected to the first subtree and other graphical blocks connected to the second subtree to simulate a response of a processor-controlled system to a layout of the graphical block diagram.

10. The apparatus of claim 1, wherein the operations comprise interpreting, using the graphical block diagram parser, the graphical block diagram according to a code generation mode that generates code to execute the graphical block diagram such that the first subtree is executed before the second subtree, and the second subtree is executed before other graphical blocks attached to the first subtree and other graphical blocks attached to the second subtree.

11. The apparatus of claim 10, wherein the code is C.

12. The apparatus of claim 1, wherein the graphics processor is controlled by at least one processor of the one or more processors, wherein the graphical block diagram parser is implemented by at least one processor of the one or more processors, and wherein at least one processor of the one or more processors is configured to compile the graphical block diagram to run on an embedded computer.

13. A method for processing a graphical block diagram, comprising:

receiving, at a computing device, the graphical block diagram comprising a set of graphical blocks, at least some of the graphical blocks of the set of graphical blocks arranged in parallel subtrees of a root graphical block of the set of graphical block, the parallel subtrees including at least a first subtree and a second subtree, and the graphical block diagram including an execution order block of the set of graphical blocks having at least a first input and a second input, the first subtree connected to the first input and the second subtree connected to the second input;

interpreting the graphical block diagram such that, when the graphical block diagram is executed, the first subtree and the second subtree are executed according to an execution order of the execution order block before other graphical blocks of the set of graphical blocks connected to the root graphical block without affecting an execution order of the other graphical blocks, the execution order of the execution order block defined by an ordering of inputs of the execution order block, and the execution order of the other graphical blocks based on a layout of the graphical block diagram.

14. The method of claim 13, wherein the set of graphical blocks comprises at least some graphical blocks defining respective functions, and the graphical block diagram comprises a data flow diagram.

15. The method of claim 13, wherein interpreting the graphical block diagram comprises at least one of:
generating code to implement the graphical block diagram in a standard batch code; or
executing the graphical block diagram.

16. The method of claim 13, wherein the parallel subtrees include at least a third subtree and a fourth subtree, the third subtree is connected to a third input of the execution order block, and the fourth subtree is connected to a fourth input of the execution order block, and wherein interpreting the graphical block diagram comprises interpreting the graphical block diagram such that, when the graphical block diagram is executed, the first subtree, the second subtree, the third subtree, and the fourth subtree are executed according to the execution order of the execution order block before other graphical blocks of the set of graphical blocks connected to the root graphical block without affecting the execution order of the other graphical blocks.

17. The method of claim 16, wherein the first subtree, the second subtree, the third subtree, and the fourth subtree are arranged relative to the root graphical block such that, without the execution order block, an order in which the first subtree, the second subtree, the third subtree, and the fourth subtree would be executed is different from the execution order of the execution order block.

18. A method for producing a graphical block diagram, comprising:
presenting, for viewing by a user, a set of graphical blocks comprising:
an execution order block having a variable number plurality of inputs and no output,
a plurality of additional graphical blocks,
wherein each input of the plurality of inputs is attached to respective graphical block of the plurality of additional graphical blocks, and
wherein the execution order block defines an execution order of the graphical blocks attached to the plurality of inputs;
generating, responsive to input from the user, the graphical block diagram for display on an output screen, the graphical block diagram comprising at least some of the graphical blocks of the set of graphical blocks arranged in parallel subtrees of a root graphical block, the root graphical block being selected from among the set of graphical blocks, the parallel subtrees including at least a first subtree and a second subtree, and the graphical block diagram including the execution order block, the plurality of inputs comprising at least a first input and a second input, the first subtree connected to the first input and the second subtree connected to the second input; and
interpreting the graphical block diagram such that, when the graphical block diagram is executed, the first subtree and the second subtree are executed according to the execution order defined by the execution order block.

19. The method of claim 18, wherein the first subtree is connected to a first subtree root block of the root graphical block, the second subtree is connected to a second subtree root block of the root graphical block, the first substrate root block and the second subtree root block being selected from among the set of graphical blocks, the second subtree root block being above the first subtree root block in a layout of the graphical block diagram as displayed on the output screen, and
wherein interpreting the graphical block diagram comprises executing the first subtree, executing the second subtree after executing the first subtree, executing the second subtree root block after executing the second subtree, and executing the first subtree root block after executing the second subtree root block.

* * * * *

UNITED STATES PATENT AND TRADEMARK OFFICE
CERTIFICATE OF CORRECTION

PATENT NO. : 10,445,072 B1
APPLICATION NO. : 15/402543
DATED : October 15, 2019
INVENTOR(S) : Peter Darnell It is certified that error appears in the above-identified patent and that said Letters Patent is hereby corrected as shown below:

In the Claims

Column 15, Line 33:
In Claim 18, after "a" delete "variable number".

Signed and Sealed this
Twenty-eighth Day of January, 2020

Andrei Iancu
*Director of the United States Patent and Trademark Office*